United States Patent
Liu et al.

(10) Patent No.: US 12,150,294 B2
(45) Date of Patent: Nov. 19, 2024

(54) METHOD FOR MANUFACTURING SEMICONDUCTOR STRUCTURE AND SAME

(71) Applicant: CHANGXIN MEMORY TECHNOLOGIES, INC., Hefei (CN)

(72) Inventors: Zhongming Liu, Hefei (CN); Shijie Bai, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 413 days.

(21) Appl. No.: 17/545,213

(22) Filed: Dec. 8, 2021

(65) Prior Publication Data

US 2022/0278107 A1    Sep. 1, 2022

Related U.S. Application Data

(63) Continuation of application No. PCT/CN2021/120250, filed on Sep. 24, 2021.

(30) Foreign Application Priority Data

Mar. 1, 2021 (CN) .......................... 202110226832.5

(51) Int. Cl.
*H10B 12/00* (2023.01)
*H01L 21/768* (2006.01)
*H01L 23/522* (2006.01)

(52) U.S. Cl.
CPC ..... *H10B 12/482* (2023.02); *H01L 21/76877* (2013.01); *H01L 23/5226* (2013.01); *H10B 12/315* (2023.02)

(58) Field of Classification Search
CPC .... H10B 12/482; H10B 12/315; H10B 12/01; H10B 12/05; H10B 12/053; H10B 12/056;
(Continued)

(56) References Cited

U.S. PATENT DOCUMENTS 6,376,358 B1 * 4/2002 Fischer ............. H01L 21/76895
257/E21.507
6,417,097 B1 * 7/2002 Hwang ............. H01L 21/76834
257/E21.507
(Continued)

FOREIGN PATENT DOCUMENTS

CN    107546226 A    1/2018
CN    110364529 A    10/2019
(Continued)

*Primary Examiner* — Eduardo A Rodela
(74) *Attorney, Agent, or Firm* — Kilpatrick Townsend & Stockton LLP

(57) ABSTRACT

A method for manufacturing a semiconductor structure includes: providing a base, in which a plurality of bit lines extending in a first direction and a groove located between two adjacent ones of the bit lines are provided on the base; forming an initial contact layer and an initial protection layer filling the groove, in which the initial contact layer is in contact with the base, the initial protection layer is located on the initial contact layer; patterning the initial contact layer and the initial protection layer to form contact layers that are discrete from each other and protection layers that are discrete from each other; and forming a dielectric layer between two adjacent ones of the contact layers, in which the dielectric layer is further located between two adjacent ones of the protection layers, a material of the dielectric layer is different from a material of the protection layer.

18 Claims, 10 Drawing Sheets

(58) Field of Classification Search
CPC ...... H10B 12/34; H10B 12/36; H10B 12/377; H10B 12/485; H01L 21/76877; H01L 23/5226; H01L 2924/1436
See application file for complete search history.

(56) References Cited

U.S. PATENT DOCUMENTS

| | | | |
|---|---|---|---|
| 8,822,335 | B2 | 9/2014 | Lee et al. |
| 9,184,091 | B2 * | 11/2015 | Song ................. H01L 21/76897 |
| 9,437,420 | B2 * | 9/2016 | Cho ................. H01L 21/02192 |
| 10,109,507 | B2 * | 10/2018 | Liu ................. H01L 29/66545 |
| 10,700,066 | B2 * | 6/2020 | Chen ..................... H01L 27/092 |
| 2014/0179101 | A1 | 6/2014 | Lee et al. |
| 2014/0231892 | A1 | 8/2014 | Song et al. |

FOREIGN PATENT DOCUMENTS

| | | |
|---|---|---|
| CN | 110544693 A | 12/2019 |
| CN | 110875318 A | 3/2020 |
| CN | 111900167 A | 11/2020 |
| CN | 112652623 A | 4/2021 |
| CN | 113097144 A | 7/2021 |

* cited by examiner

METHOD FOR MANUFACTURING SEMICONDUCTOR STRUCTURE AND SAME

CROSS-REFERENCE TO RELATED APPLICATIONS

The application is a continuation application of International Application No. PCT/CN2021/120250, filed on Sep. 24, 2021, which claims priority to Chinese Patent Application No. 202110226832.5, filed on Mar. 1, 2021. The disclosures of International Application No. PCT/CN2021/120250 and Chinese Patent Application No. 202110226832.5 are hereby incorporated by reference in their entireties.

BACKGROUND

A Dynamic Random Access Memory (DRAM for short) in a semiconductor structure is a semiconductor memory widely applied to computer systems. The main principle of the DRAM is to use the amount of charges stored in a capacitor to represent a binary bit of 1 or 0.

In order to increase the integration level of semiconductor integrated circuits, the feature size of the DRAM is becoming increasingly small. Accordingly, the process of manufacturing a DRAM becomes increasingly difficult, and the performance of the DRAM needs to be further improved.

SUMMARY

Embodiments of the disclosure relate to, but not limited to, a method for manufacturing a semiconductor structure and a semiconductor structure.

Embodiments of the disclosure provide a method for manufacturing a semiconductor structure. The method includes: providing a base, in which a plurality of bit lines extending in a first direction and a groove located between two adjacent ones of the bit lines are provided on the base; forming an initial contact layer and an initial protection layer filling the groove, in which the initial contact layer is in contact with the base, the initial protection layer is located on the initial contact layer; performing a patterning treatment to the initial contact layer and the initial protection layer to form contact layers that are discrete from each other and protection layers that are discrete from each other; and forming a dielectric layer between two adjacent ones of the contact layers, in which the dielectric layer is further located between adjacent protection layers, and a material of the dielectric layer is different from a material of the protection layers.

Embodiments of the disclosure further provide a semiconductor structure. The semiconductor structure includes: a base, in which a plurality of bit lines extending in a first direction are provided on the base; a plurality of contact layers, each located between two adjacent ones of the bit lines and being discrete from each other, in which the contact layers are in contact with the base, top surfaces of the contact layers are lower than top surfaces of the bit lines; and a dielectric layer located between two adjacent ones of the contact layers, in which the dielectric layers is in contact with the base.

BRIEF DESCRIPTION OF THE DRAWINGS

One or more embodiments are exemplarily described by using drawings that correspond to the one or more embodiments. These exemplary descriptions do not constitute a limitation to the embodiments. Unless specifically indicated, the drawings do not constitute any limitation on proportion.

DETAILED DESCRIPTION

Figure 1:
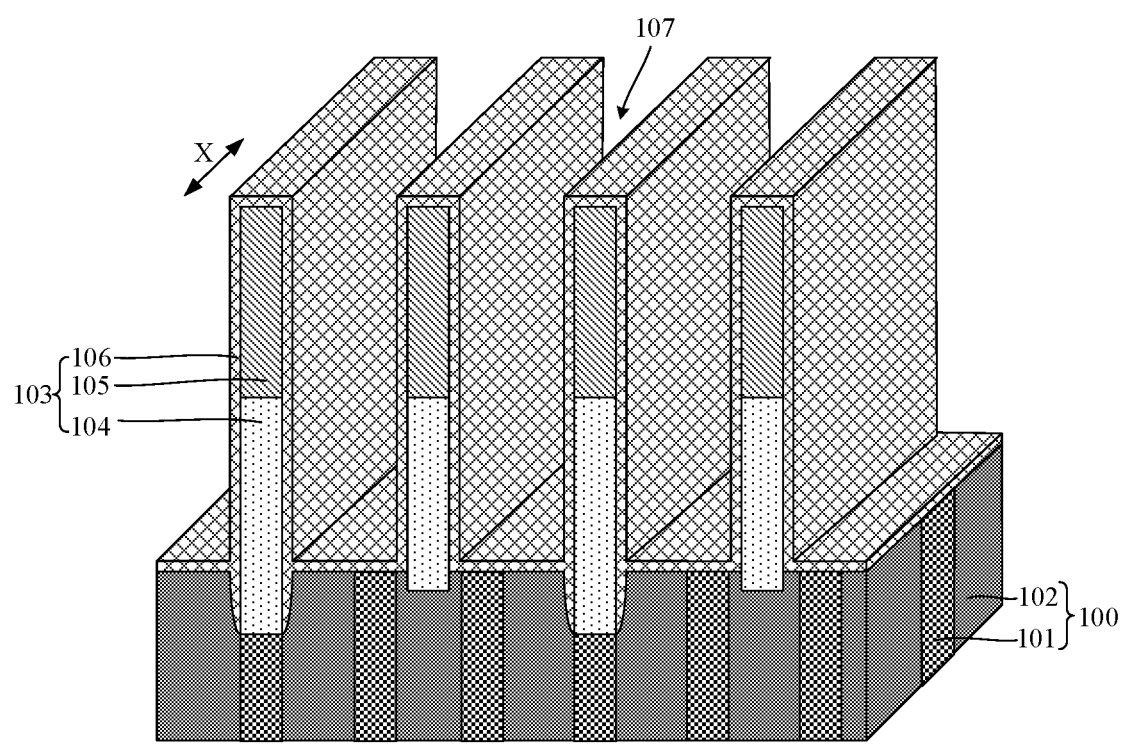
FIG. 1 to FIG. 10 are schematic structural diagrams corresponding to each step in a method for manufacturing a semiconductor structure according to embodiments of the disclosure.

As can be seen from the background, a process of manufacturing a DRAM is relatively difficult, and the performance of the DRAM needs to be further improved. The DRAM usually includes structures such as a base, a bit line, a capacitor, and a contact layer. The contact layer is used for electrically connecting the base and the capacitor. It is found by analysis that the current process of manufacturing a contact layer is relatively complex, and thus the difficulty of the process of manufacturing the DRAM is increased. In addition, the electrical performance of the contact layer is relatively poor, and thus the performance of the DRAM is reduced. It is found by the further analysis that in the process of forming the contact layer, a concave morphology tends to occur on a sidewall of the contact layer. The concave of the sidewall will reduce the volume of the contact layer, and then increase the resistance of the contact layer. As a result, the electrical performance of the contact layer is reduced.

A method for forming a contact layer usually includes forming an initial contact material layer filling up a groove between adjacent bit lines; and patterning the initial contact material layer to form contact layers that are discrete from each other, that is, a part of the initial contact material layer is removed by an etching process, and the remaining initial contact material layer serves as the contact layers. However, as the feature size of the DRAM keeps decreasing, a ratio of a height to a width of the initial contact material layer becomes increasingly large. A relatively large aspect ratio increases the difficulty of etching the initial contact material layer. In addition, a relatively large height of the initial contact material layer further increases an etching time, and thus the degree of etching the sidewall of the initial contact material layer by an etching gas is increased. As a result, the eventually formed contact layers have concave morphology of the sidewall.

Embodiments of the disclosure provide a method for manufacturing a semiconductor structure, which comprises the following operations. An initial contact layer filling a groove and an initial protection layer located on the initial contact layer are firstly formed. Compared with that the initial contact layer alone occupies the entire groove, as the initial protection layer occupies a certain height in the groove, a stacked structure of the initial protection layer and the initial contact layer can reduce the height of the initial contact layer. In a process of patterning the initial contact layer, a relatively small height of the initial contact layer can reduce the difficulty of process. In addition, a relatively small height can also shorten the time of patterning, thereby reducing the erosion on sidewalls of the initial contact layer to avoid forming the concave morphology of the sidewall. Therefore the electrical performance of the eventually formed contact layer can be improved.

To make the objectives, technical solutions, and advantages of the embodiments of the disclosure more clear, the embodiments of the disclosure are described in detail hereinafter in combination with the drawings. However, it is understandable for those of ordinary skill in the art that many technical details are provided in the embodiments of the disclosure so that readers can better understand the disclosure. However, even in the absence of these technical details and various changes and modifications based on the following embodiments, the technical solutions claimed in the disclosure can be implemented.

Embodiments of the disclosure provide a method for manufacturing a semiconductor structure. FIG. 1 to FIG. 10 are schematic structural diagrams corresponding to each step in a method for manufacturing a semiconductor structure according to embodiments of the disclosure. Detailed description is provided below in combination with the drawings.

Referring to FIG. 1, a base 100 is provided. Bit lines 103 extending in a first direction X and groove 107 located between adjacent bit lines 103 are provided on the base 100.

In the embodiments of the disclosure, the bit lines 103 and the grooves 107 both extend in the first direction X.

The base 100 includes a plurality of active areas 101 that are discrete from each other. A source electrode and a drain electrode are provided in each active area 101, and a subsequently formed capacitor needs to be electrically connected to the source/drain. The material of the active areas 101 may be monocrystalline silicon. The monocrystalline silicon contains doped ions such as boron ions or phosphorus ions.

The base 100 further includes an isolation structure 102 used for isolating adjacent active areas 101. The material of the isolation structure 102 is the insulating material, for example, may be silicon dioxide, silicon carbide or silicon nitride.

Each bit line 103 includes a conductive layer 104 and an insulating cap layer 105 that are stacked and an isolation layer 106 that covers sidewalls of the conductive layer 104 and the insulating cap layer 105.

In the embodiments of the disclosure, the conductive layer 104 may include a bit line contact layer, a barrier layer and a metal layer that are stacked. The bit line contact layer is used for electrically connecting the metal layer and the active area 101 in the base 100. The material of the bit line contact layer may be polycrystalline silicon. The barrier layer is used for obstructing mutual diffusion between the metal layer and the bit line contact layer, and is further used for increasing the adhesiveness between the metal layer and the bit line contact layer. The material of the barrier layer may be titanium nitride or tantalum nitride. The material of the metal layer may be tungsten or molybdenum.

The insulating cap layer 105 is used for preventing the oxidation of the conductive layer. The material of the insulating cap layer 105 is the insulating material. In the embodiments of the disclosure, the material of the insulating cap layer 105 is silicon nitride which has a relatively high hardness and density, and thus can improve the effect of isolation.

In the embodiments of the disclosure, the isolation layer 106 is located on the top surface of the insulating cap layer 105 and the surface of the base 100. In some embodiments of the disclosure, the isolation layer may cover only the sidewalls of the conductive layer. The isolation layer 106 can prevent the conductive layer 104 from being electrically connected to a subsequently formed contact layer. The material of the isolation layer 106 may be silicon nitride or silicon oxynitride.

A contact layer is subsequently formed in each of the grooves 107. The contact layer is used for electrically connecting the source/drain to the subsequently formed capacitor. Therefore, each groove 107 exposes all of the sources/drains in the first direction X, to enable the subsequently formed contact layer to be in contact with the sources/drains.

Figure 2:
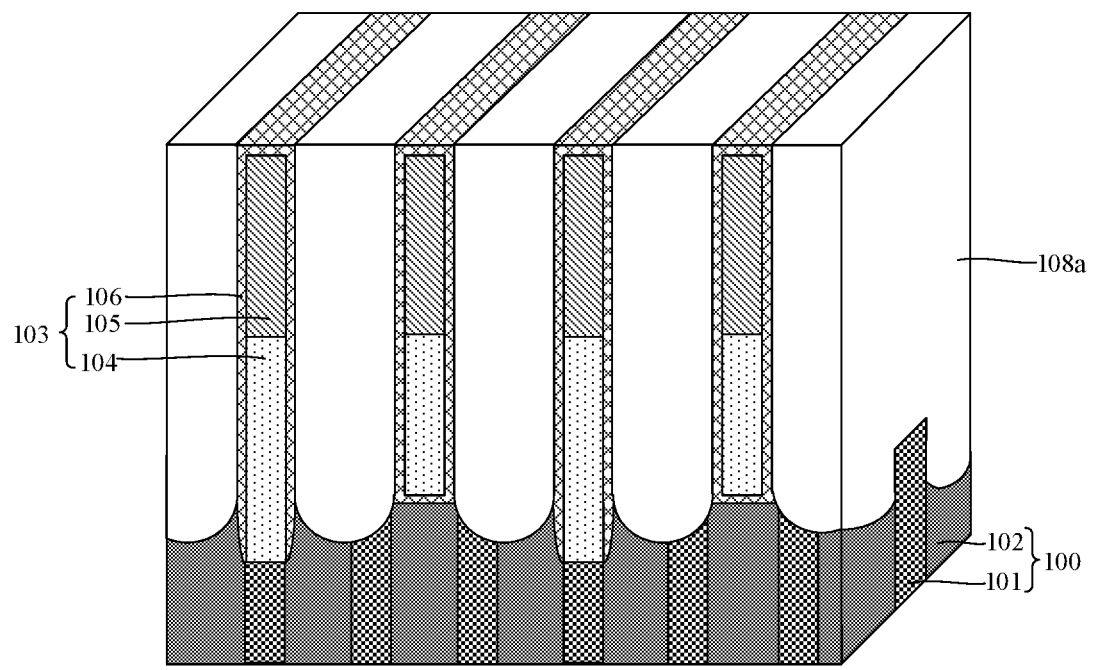
Figure 3:
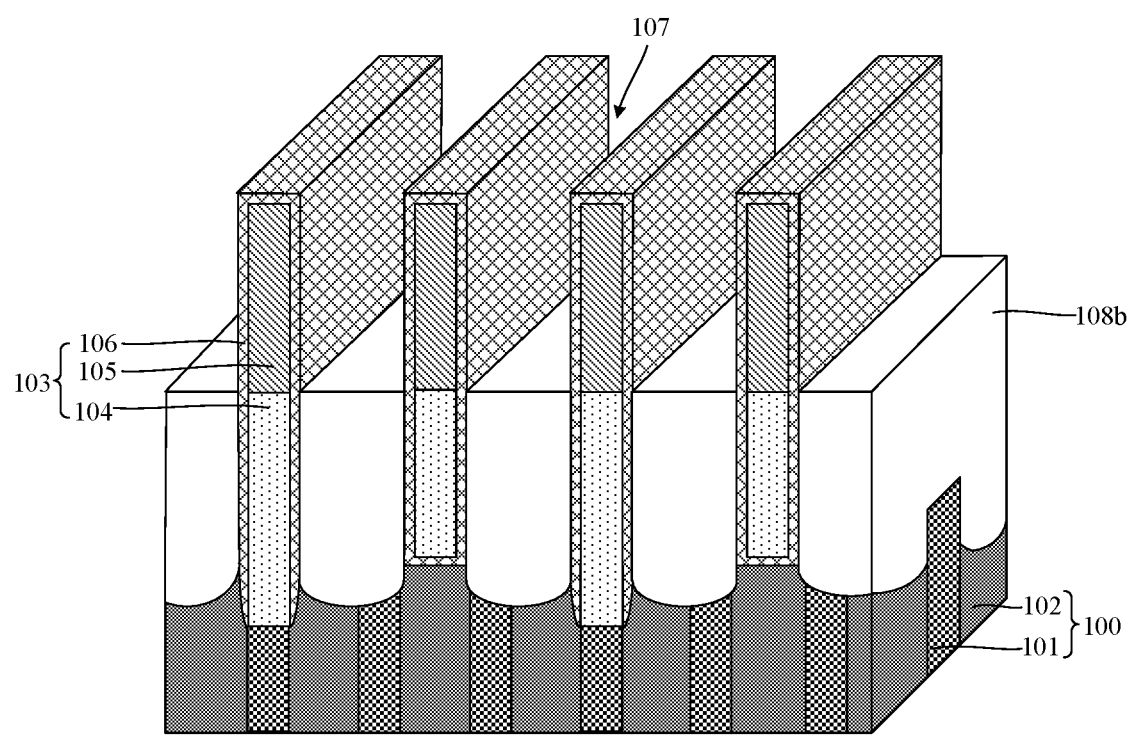
Figure 4:
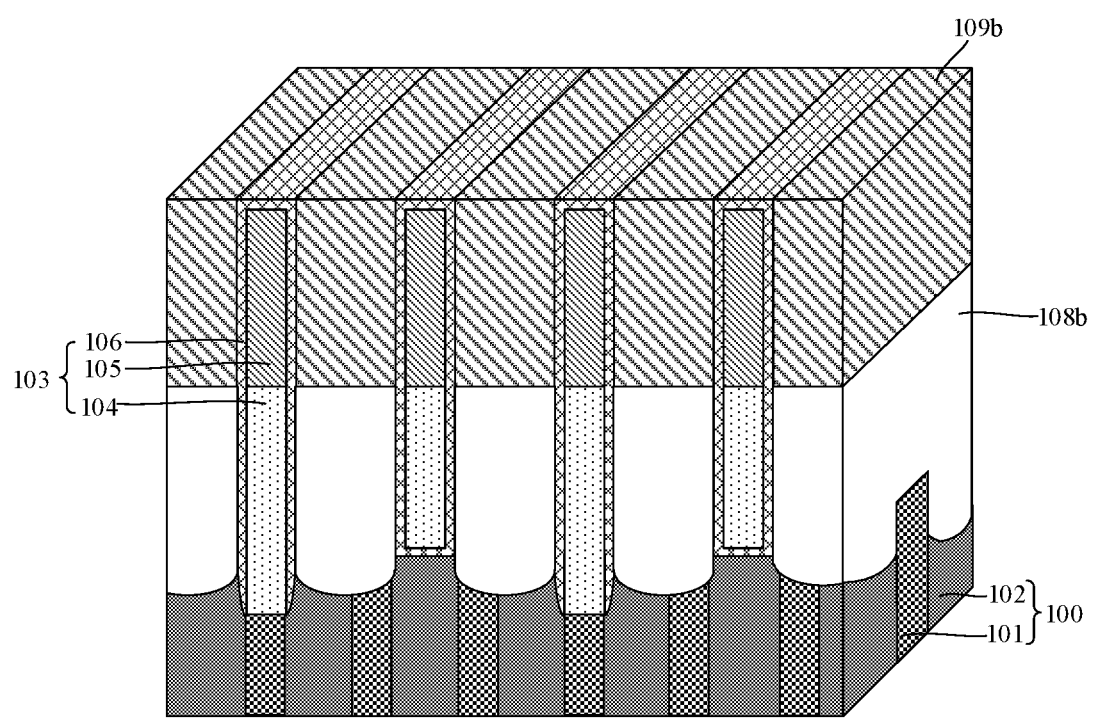

Referring to FIG. 2 to FIG. 4, an initial contact layer 108b and an initial protection layer 109b filling each groove 107 (referring to FIG. 1) are formed. The initial contact layer 108b is in contact with the base 100. The initial protection layer 109b is located on the initial contact layer 108b.

In the embodiments of the disclosure, the material of the initial contact layer 108b is the conductive material. In the embodiments of the disclosure, the material of the initial contact layer 108b is polycrystalline silicon. There are relatively small number of interface defects between the initial contact layer 108b of polycrystalline silicon material and the active area 101 of silicon material. In some embodiments of the disclosure, the material of the initial contact layer may be polycrystalline germanium.

The initial protection layer 109b is located on the surface of the initial contact layer 108b, which is away from the base 100. It can be understood that in the case that the depth of the groove 107 remains unchanged, since the initial protection layer 109b occupies certain space in the depth direction of the groove 107, the stacked construction of the initial protection layer 109b and the initial contact layer 108b reduces the space occupied by the initial contact layer 108b in the depth direction of the groove 107 correspondingly (that is, the height of the initial contact layer 108b is reduced), compared with that the groove 107 is filled up with only the initial contact layer 108b. In this way, the difficulty of subsequently patterning the initial contact layer 108b can be reduced. The time for etching the initial contact layer 108b also can be reduced, and thus the degree of etching on sidewalls of the initial contact layer 108b is reduced to ensure that an eventually formed contact layer has a relatively vertical morphology of the sidewall, thereby improving the electrical performance of the contact layer.

There is a relatively good interface contact state between the initial protection layer 109b and the initial contact layer 108b. In the embodiments of the disclosure, there are relatively fewer defects, such as cavities, protrusions or concaves, of the interface. It can be understood that in the process of patterning, when etching to the junction between the initial protection layer 109b and the initial contact layer 108b, because there are a relatively fewer defects at the interface, it is very difficult for the etching gas to enter positions where the defects such as cavities, protrusions, or concaves exist. Therefore, it is very difficult for the etching gas to increase the volumes of defects, and the etching gas does not result in uneven morphology on the interface and sidewalls corresponding to the interface. That is, the good interface contact state between the initial protection layer 109b and the initial contact layer 108b can improve the uniformity of etching, and thus the precision of patterns can be increased and the flatness of the sidewalls corresponding to the interface can be further improved.

Silicon oxide and polycrystalline silicon have relatively good affinity and relatively good interface contact state. In the embodiments of the disclosure, the material of the initial protection layer 109b may be silicon oxide. In some embodiments of the disclosure, the material of the initial protection layer 109b may be silicon oxynitride.

In some embodiments of the disclosure, forming an initial contact layer 108b and an initial protection layer 109b includes the following operations:

Referring to FIG. 2, an initial contact material layer 108a filling up each groove 107 (referring to FIG. 1) is formed.

In the embodiments of the disclosure, the initial contact material layer 108a is formed by using the low-pressure chemical vapor deposition method.

The reactive gas in low-pressure chemical vapor deposition may be $H_3SiN(C_3H_7)_2$, $Si_2H_6$ or $SiH[N(CH_3)_2]_3$.

The temperature of the low-pressure chemical vapor deposition is 380° C. to 500° C., and may be, for example, 400° C., 450° C. or 480° C. The temperature being in the foregoing range can enhance the activity of the reactive gas, and thus increase the reaction rate, thereby further increasing the formation rate of the initial contact material layer 108a.

The pressure of low-pressure chemical vapor deposition is 1 Torr to 3 Torr, for example, may be 1.5 Torr or 2 Torr. The pressure being the foregoing range can increase the gas diffusion coefficient, and thus increase mass transfer rates of gaseous reactants and byproducts, thereby further increasing the formation rate of the initial contact material layer 108a.

In some embodiments of the disclosure, the initial contact material layer also can be formed by using an atmospheric-pressure chemical vapor deposition method.

In the embodiments of the disclosure, before the initial contact material layer 108a is formed, the isolation layer 106 on the surface of the base 100 is removed, and a part of the isolation structure 102 is removed, so as to increase the area of the exposed surface of the active area 101. In this way, the contact area between the formed initial contact layer 108b and the active area 101 can be increased, thereby reducing the contact resistance.

In the embodiments of the disclosure, after the initial contact material layer 108a is formed, chemical mechanical polishing is performed on the top surface of the initial contact material layer 108a to improve the flatness of the top surface of the initial contact material layer 108a.

Referring to FIG. 3, the initial contact material layer 108a (referring to FIG. 2) is etched back, to make the top surface of the remaining initial contact material layer 108a be lower than the top surfaces of the bit lines 103. The remaining initial contact material layer 108a serves as the initial contact layer 108b.

In the direction perpendicular to the bottom of the groove 107, the ratio of the height of the initial contact layer 108b to the height of the bit line 103 is 1:3 to 2:3. It can be understood that if the height of the initial contact layer 108b is too large, correspondingly, the difficulty of subsequently patterning the initial contact layer 108b is increased. If the height of the initial contact layer 108b is too small, the resistance of the initial contact layer 108b is increased thereby reducing the operating speed of the semiconductor structure. The initial contact layer 108b with the foregoing range of the height can have a relatively small resistance, and can reduce the difficulty of subsequent patterning at the same time.

In the embodiments of the disclosure, the top surface of the initial contact layer 108b is flush with the top surface of the conductive layer 104.

Referring to FIG. 4, the initial protection layer 109b is formed on the initial contact layer 108b. The top surface of the initial protection layer 109b is not lower than the top surface of the bit line 103.

In the embodiments of the disclosure, the top surface of the initial protection layer 109b is flush with the top surface of the bit line 103. In some embodiments of the disclosure, the top surface of the initial protection layer may be higher than the top surface of the bit line.

In the embodiments of the disclosure, the method for forming the initial protection layer 109b is the spin coating process. The spin coating process can increase the uniformity of the initial protection layer 109b, and can further reduce gaps formed in the initial protection layer 109b. In addition, the spin coating process has high the production efficiency and low cost. In some embodiments of the disclosure, the initial protection layer can be formed by using the chemical vapor deposition method.

In the embodiments of the disclosure, after the initial protection layer 109b is formed, chemical mechanical polishing is further performed on the top surface of the initial protection layer 109b, to improve the flatness of the top surface of the initial protection layer 109b.

Figure 5:
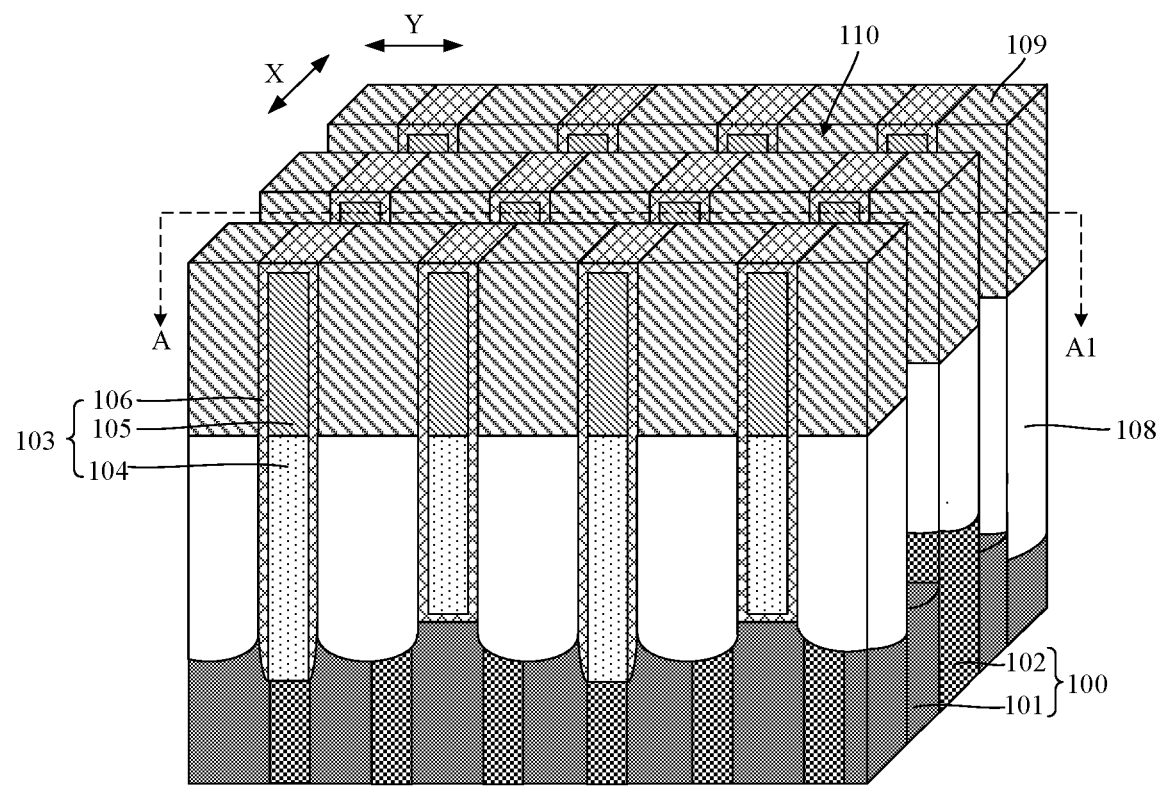
Figure 6:
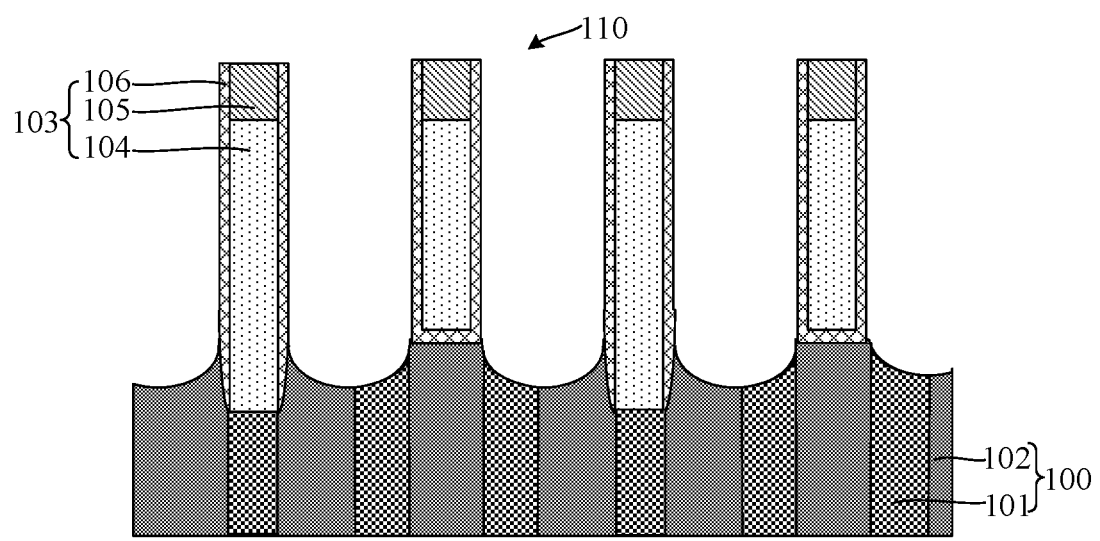

Referring to FIG. 5 and FIG. 6, FIG. 6 is the sectional view of FIG. 5 in a direction A-A1. The initial contact layer 108b (referring to FIG. 4) and the initial protection layer 109b (referring to FIG. 4) are patterned, so as to form contact layers 108 that are discrete from each other and protection layers 109 that are discrete from each other.

In the embodiments of the disclosure, the initial contact layer 108b, the initial protection layer 109b and a part of the insulating cap layer 105 are etched to form isolation grooves 110 spanning the initial protection layer 109b and the insulating cap layer 105. Each of the isolation grooves 110 further penetrates the initial contact layer 108b. The bottom of the isolation groove 110 located in the remaining insulating cap layer 105 is higher than the top of the conductive layer 104.

In the embodiments of the disclosure, a part of the isolation layer 106 is also etched off. That is, as for each bit line 103, only a part of thickness of the insulating cap layer 105 and a part of thickness of the isolation layer 106 are removed, and the entire conductive layer 104, a part of thickness of the insulating cap layer 105 and a part of thickness of the isolation layer 106 are retained.

The isolation groove 110 extends in the second direction Y, and the second direction Y is different from the first direction X. In the embodiments of the disclosure, the second direction Y is perpendicular to the first direction X. In some embodiments of the disclosure, the angle between the second direction and the first direction may be less than 90° and greater than or equal to 75°.

The remaining initial contact layer 108b serves as the contact layers 108, and the remaining initial protection layer 109b serves as the protection layers 109.

The method for forming the isolation grooves 110, the contact layers 108, and the protection layers 109 is described below in detail.

A mask layer extending in the second direction Y is formed on the initial protection layer 109b and the bit line 103. The initial protection layer 109b is etched by using the mask layer as a mask.

The material of the mask layer is a carbon-containing material, for example, may be diamond-like carbon or amorphous carbon. The foregoing materials have relatively large hardness, and there is a relatively high etching selection ratio of the foregoing materials to the initial protection layer 109b of silicon oxide. Therefore, the patterning process does not cause excessive consumption of the mask layer, and does not cause over etching of the initial protection layer 109b covered by the mask layer.

Since part of the insulating cap layers 105 and part of the isolation layers 106 are not covered by the mask, in the process of etching the initial protection layer 109b, the part of the insulating cap layer 105 and the part of the isolation layer 106 are etched. To increase the etching selection ratio of the initial protection layer 109b to the insulating cap layer 105, the radio frequency power may be set to be higher than 400 W, and the temperature of etching may be set to 40° C.

to 80° C. In this way, it can be ensured that the remaining insulating cap layer 105 has a relatively large thickness to protect the conductive layer 104.

The etching gas may be $C_4F_6$, $C_4F_8$, $O_2$, Ar, CO, $N_2$ or the like.

In the embodiments of the disclosure, when the initial protection layer 109b (referring to FIG. 4) is penetrated, etching is stopped. The remaining initial protection layer 109b, which are discrete from each other, serves as the protection layers 109.

After the etching of the initial protection layer 109b is completed, the mask layer is removed by using a plasma ashing process, and the initial contact layer 108b (referring to FIG. 4) is patterned by using the protection layers 109 as a mask.

In some embodiments of the disclosure, the reactive gas of plasma ashing may be a mixed gas of $O_2$ and $N_2$. An oxidation layer is generated on the surface of the initial contact layer 108b in the process of plasma ashing, and the oxidation layer can be removed by using a fluorine containing gas in order to prevent the oxidation layer from affecting the subsequent patterning of the initial contact layer 108b.

The etching selection ratio of the initial contact layer 108b to the insulating cap layer 105 in the patterning process is 3:1 to 50:1. When the etching selection ratio of the initial contact layer 108b to the insulating cap layer 105 is relatively large, the problem that the initial contact layer 108b fails to be penetrated can be avoided, and the problem that the entire insulating cap layer 105 is removed and the conductive layer 104 is exposed can be avoided.

In the embodiments of the disclosure, patterning is performed by using a dry etching process. The temperature of dry etching is 20° C. to 80° C., and for example, may be 40° C., 60° C. or 70° C. The temperature of dry etching affects the speed of the reaction between the etching gas and the material to be etched. When the temperature of dry etching is within the foregoing range, the relatively high etching rate can be obtained.

The pressure of dry etching is 5 mTorr to 50 mTorr, and for example, may be 10 mTorr, 30 mTorr or 40 mTorr. The pressure herein refers to a pressure in a processing chamber. If the pressure in the chamber is smaller, the molecular density of the etching gas in the chamber is smaller and thus physical etching of plasma is stronger, and on comparison, the etching selection ratio is smaller. Therefore, when the pressure of dry etching is within the foregoing relatively large range, the etching selection ratio of the initial contact layer 108b to the insulating cap layer 105 can be increased to some extent.

The radio frequency power of dry etching is 400 W to 1500 W, and for example, may be 600 W, 800 W or 1000 W. When the radio frequency power is within the foregoing range, the ion beam has relatively sufficient energy, and thus the etching rate can be increased.

In the embodiments of the disclosure, the etching gas of dry etching is $C_4F_6$. The fluorine-containing gas has relatively good isotropy for the etching of polycrystalline silicon, which can make the eventually formed contact layer 108 have a relatively vertical morphology of sidewall and further can improve the electrical performance of the contact layer 108. In some embodiments of the disclosure, the gas of dry etching may be one or more of $CF_4$, $CHF_3$, $CH_2F_2$, $C_5F_8$, $C_4F_8$, $Cl_2$, HBr, Ar, He, CO, $O_2$ and $N_2$.

Figure 7:
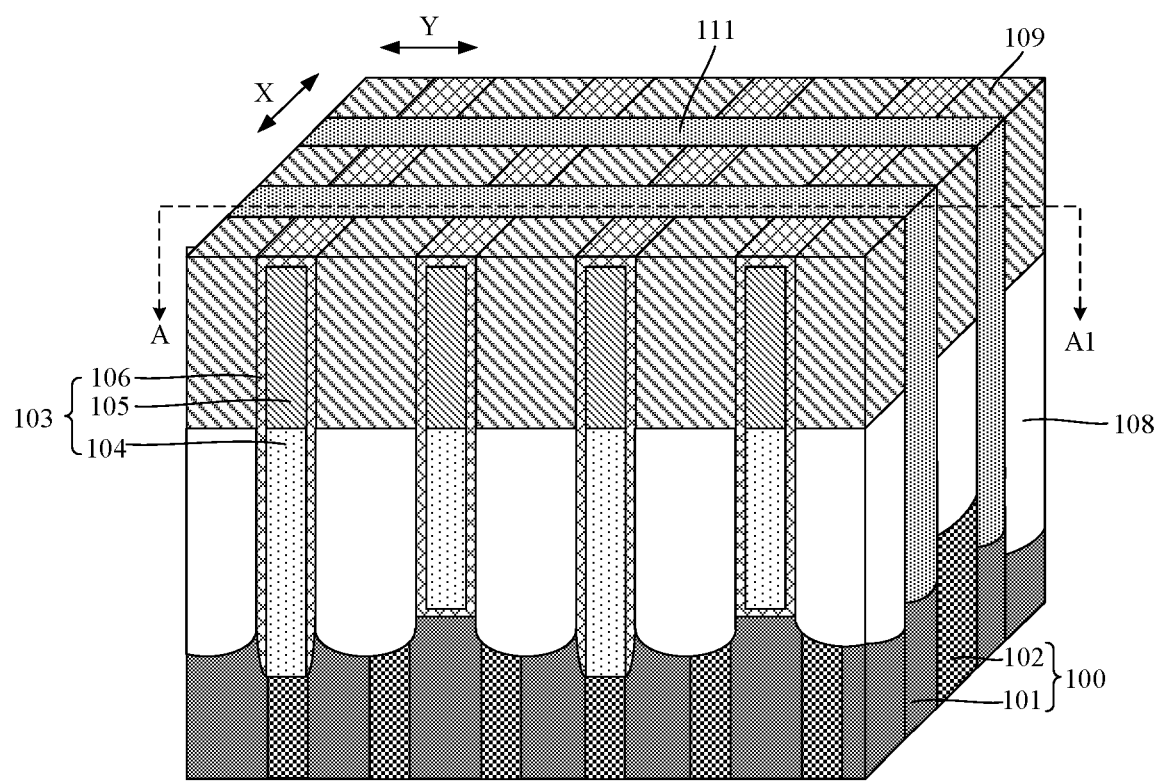
Figure 8:
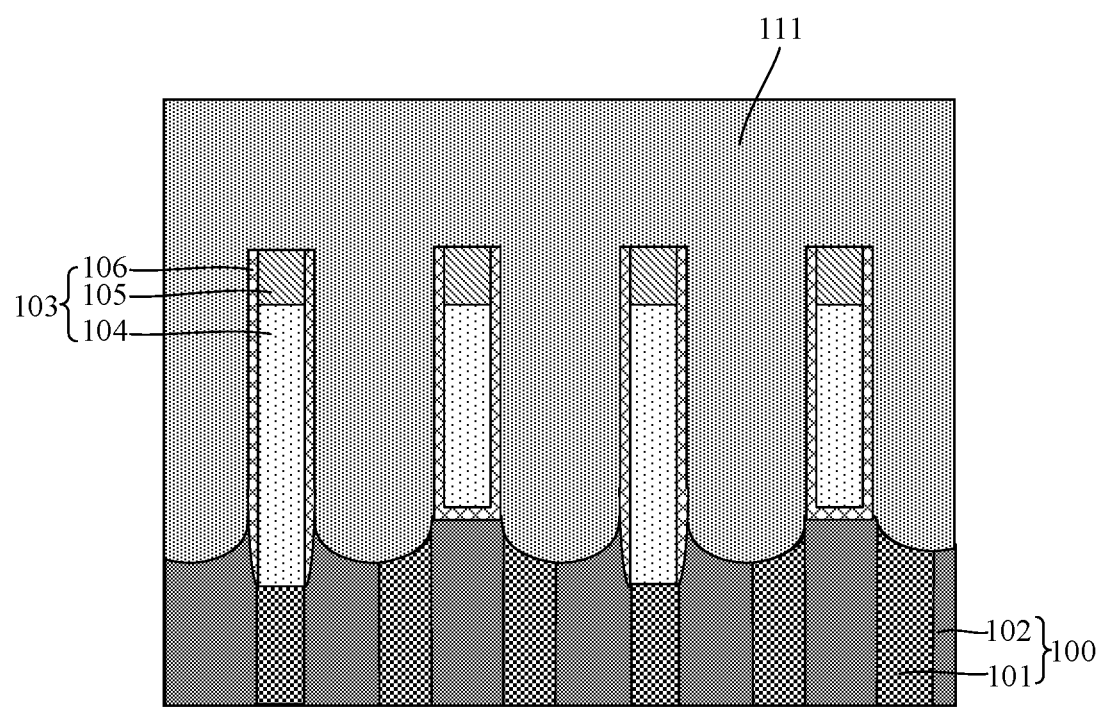

Referring to FIG. 7 and FIG. 8, a dielectric layer 111 is formed between each of adjacent contact layers 108, and the dielectric layer 111 is further located between each of adjacent protection layers 109. In the embodiments of the disclosure, the dielectric layer 111 is further located on the remaining insulating cap layers 105. In other words, the isolation grooves 110 (referring to FIG. 5) are filled with the dielectric layers 111.

The material of the dielectric layers 111 is different from the material of the protection layers 109. It can be understood that when the material of the dielectric layers 111 is different from the material of the protection layers 109, damage to the protection layers 109 can be reduced in a subsequent process of removing the protection layers 109. In the embodiments of the disclosure, the material of the protection layers 109 is silicon oxide, and the material of the dielectric layers 111 is silicon nitride. Since the hardness of silicon nitride is greater than the hardness of silicon oxide, it is easier to remove silicon oxide than silicon nitride. In some embodiments of the disclosure, the material of the protection layers may be silicon oxycarbide, and the material of the dielectric layers may be silicon oxynitride.

Figure 9:
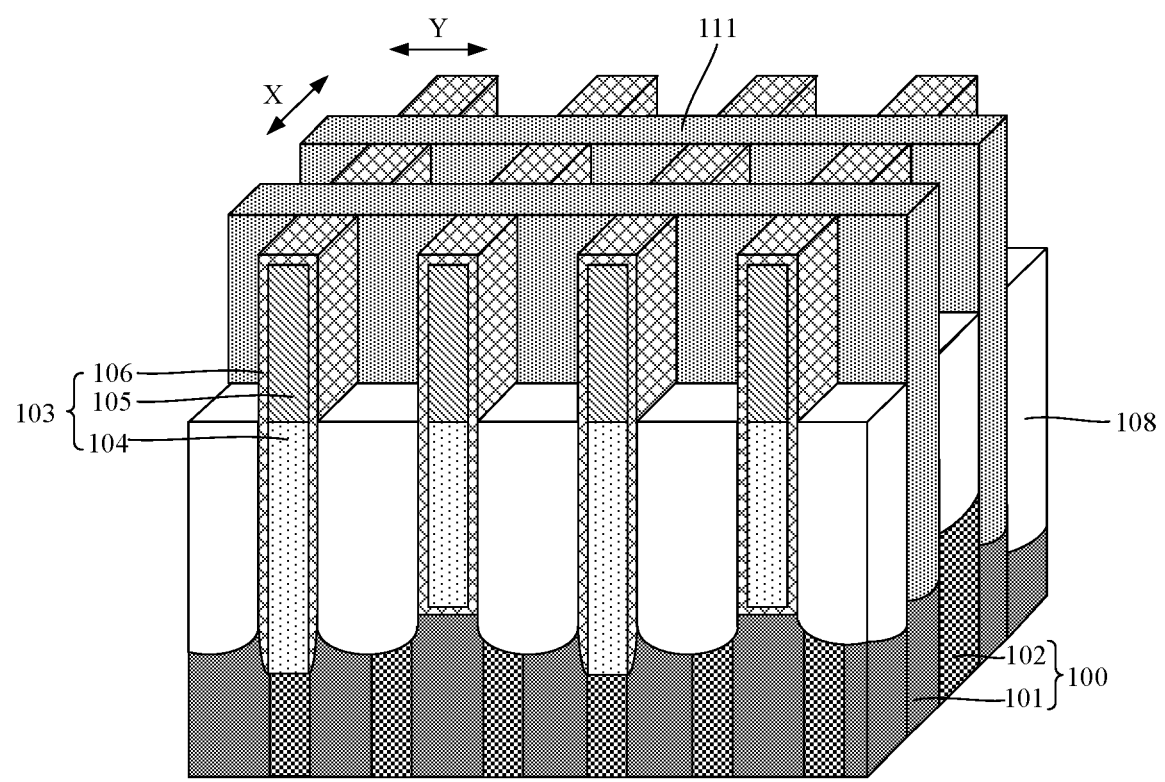

Referring to FIG. 9, after the dielectric layer 111 is formed, the protection layers 109 (referring to FIG. 7) are removed.

In some embodiments of the disclosure, in the etching process of removing the protection layers 109, the etching selection ratio of the material of the protection layers 109 to the material of the dielectric layers 111 is 10:1~100:1. When the etching selection ratio of the protection layers 109 to the dielectric layers 111 is relatively large, it is easier to remove the protection layers 109 and more difficult to remove the dielectric layers 111, and thus the loss of the dielectric layer 111 can be reduced in the process of removing the protection layers 109, which make the dielectric layer 111 keep relatively good isolation.

In the embodiments of the disclosure, the protection layers 109 are removed by using a wet etching method. In some embodiments of the disclosure, a dry etching method may be used.

Figure 10:
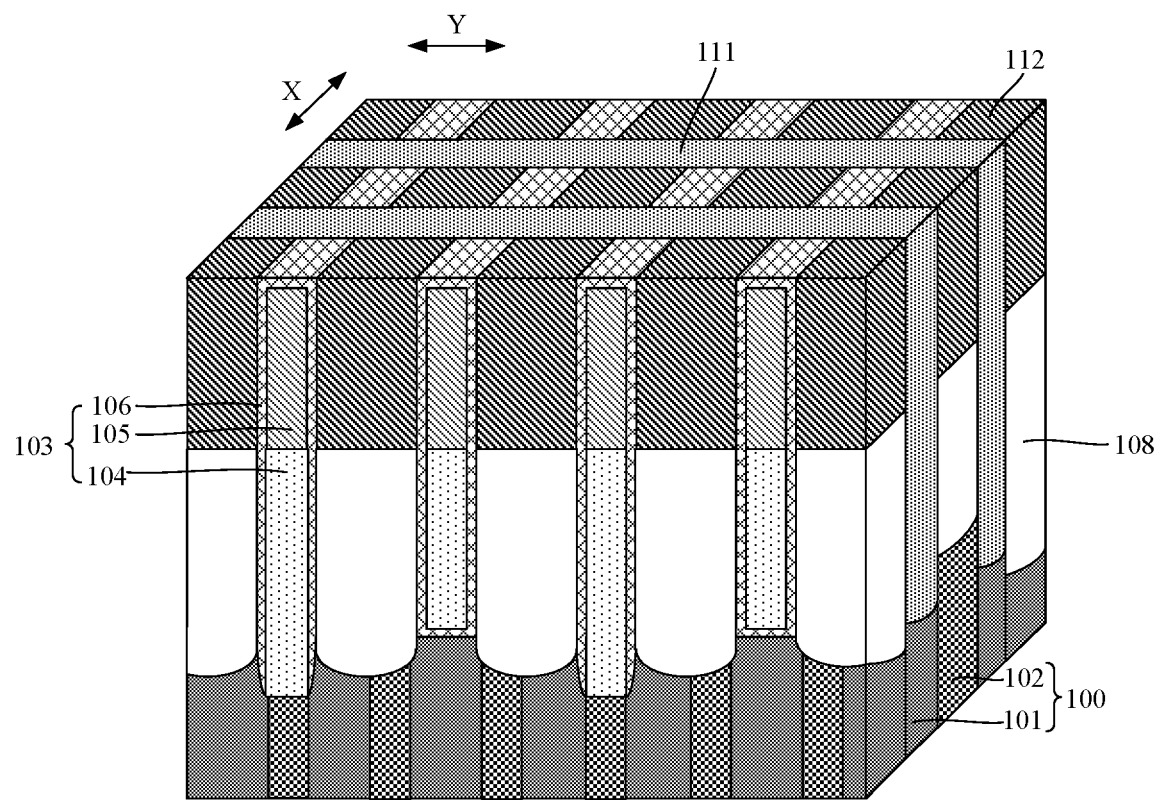

Referring to FIG. 10, a connection layer 112 is formed on each of the contact layers 108. The dielectric layer 111 is further located between each of adjacent connection layers 112. That is, the position occupied by the connection layer 112 is the position of the original protection layer 109 (referring to FIG. 7).

Each of the connection layers 112 is used for electrically connecting a contact layer 108 and a subsequently formed capacitor. The connection layers 112 have a relatively low resistance, and thus the operating speed of the semiconductor structure can be increased. The material of the connection layers 112 may be a low resistance metal such as copper, tungsten or gold. In the embodiments of the disclosure, the method for forming the connection layer 112 is a physical vapor deposition method.

In summary, in the embodiments of the disclosure, each initial protection layer 109b is formed on each initial contact layer 108b. Compared with that an initial contact layer 108b alone occupies an entire groove 107, because the height of the groove 107 does not change and the initial protection layer 109b occupies a certain height in the groove 107, the stacked construction of the initial protection layer 109b and the initial contact layer 108b can correspondingly reduce the height of the groove 107 occupied by the initial contact layer 108b (that is, the height of the initial contact layer 108b is reduced), Therefore, the difficulty of patterning the initial contact layer 108b can be reduced to avoid forming the concave morphology of the sidewalls, thereby improving the electrical performance of the eventually formed contact layer 108.

Embodiments of the disclosure further provide a semiconductor structure. FIG. 10 is a schematic diagram of a semiconductor structure according to an embodiment of the disclosure. Referring to FIG. 10, the semiconductor structure includes: a base 100, in which bit lines 103 extending in a first direction X are provided on the base 100; contact layers 108, in which the contact layers 108 are located between adjacent bit lines 103, are discrete from each other, and are in contact with the base 100, and top surfaces of the contact layers 108 are lower than top surfaces of the bit lines 103; and dielectric layers 111 located between adjacent contact layers 108, in which the dielectric layers 111 are further in contact with the base 100.

Detailed description is provided below in combination with the drawings.

The base 100 includes a plurality of active areas 101 that are discrete from each other and an isolation structure 102 used for isolating adjacent active areas 101.

Each bit line 103 includes a conductive layer 104 and an insulating cap layer 105 that are stacked and an isolation layer 106 that covers sidewalls of the conductive layer 104 and the insulating cap layer 105.

As for the detailed description related to the base 100 and the bit line 103, reference may be made to the foregoing content. Details are not described again herein.

The contact layers 108 are of pillar structures that are discrete from each other, and are located between adjacent bit lines 103. In the embodiments of the disclosure, the contact layers 108 are contact layers for capacitors, and are used for electrically connecting the active areas 101 and the capacitors (not shown). In the embodiments of the disclosure, the material of the contact layers 108 is polycrystalline silicon. In some embodiments of the disclosure, the material of the contact layers may be polycrystalline germanium.

There is no concave in the sidewalls of the contact layers 108, in which concaves may increase the resistance of the contact layer 108. Therefore, the contact layers 108 have relatively vertical morphology of sidewalls, which can improve the electrical performance of the contact layers 108, thereby increasing the operating speed of the semiconductor structure.

The connection layers 112 are located right above the contact layers 108, and the connection layers 112 are also of pillar structures that are discrete from each other. The connection layers 112 are conductive structures, have a relatively low resistivity, and may be formed with a metal such as copper, tungsten or gold.

The dielectric layers 111 are located between adjacent contact layers 108 and between adjacent connection layers 112. The dielectric layers 111 are used for isolating adjacent contact layers 108 and adjacent connection layers 112. In the embodiments of the disclosure, the dielectric layers 111 are further located in the insulating cap layers 105, and the insulating cap layers 105 expose top surfaces of the dielectric layers 111. That is, each dielectric layer 111 spans the connection layers 112 and the insulating cap layers 105, and penetrates the connection layers 112.

The dielectric layers 111 extend in a second direction Y, and the second direction Y is different from the first direction X. In the embodiments of the disclosure, the second direction Y is perpendicular to the first direction X. In some embodiments of the disclosure, an angle between the second direction and the first direction may be less than 90° and greater than or equal to 75°.

In summary, in the embodiments of the disclosure, the contact layers 108 have a relatively vertical morphology of sidewalls, and thus the electrical performance of the contact layers 108 can be improved, thereby increasing the performance of the semiconductor structure.

A person of ordinary skill in the art can understand that the foregoing implementations are specific embodiments for implementing the disclosure, and in actual applications, various changes can be made thereto in forms and details without departing from the spirit and scope of the disclosure. Any person skilled in the art can make changes and modifications without departing from the spirit and scope of the disclosure, and the scope of protection of the disclosure should be as defined by the claims.

INDUSTRIAL APPLICABILITY

Embodiments of the disclosure provide a method for manufacturing a semiconductor structure. The method includes: providing a base, in which bit lines extending in a first direction and groove located between adjacent bit lines are provided on the base; forming an initial contact layer and an initial protection layer filling each groove, in which the initial contact layer is in contact with the base, the initial protection layer is located on the initial contact layer; patterning the initial contact layer and the initial protection layer to form contact layers that are discrete from each other and protection layers that are discrete from each other; and forming dielectric layers between adjacent contact layers, in which the dielectric layers are further located between adjacent protection layers, a material of the dielectric layers is different from a material of the protection layers.

It can be seen that in the embodiments of the disclosure, the initial contact layers filling the grooves and the initial protection layers located on the initial contact layers are firstly formed. Because each initial protection layer needs to occupy a certain height in each groove, compared with that an initial contact layer alone occupies a entire groove, the stacked structure of the initial protection layer and the initial contact layer can reduce the height of the initial contact layer. In the process of patterning the initial contact layers, a relatively small height of the initial contact layers can reduce the difficulty of the process. In addition, a relatively small height can also shorten the time of patterning, thereby reducing the erosion on sidewalls of the initial contact layers to avoid forming a concave morphology of the sidewalls, thereby improving the electrical performance of the eventually formed contact layer.

In addition, the ratio of the height of the initial contact layers to the height of the bit lines is 1:3 to 2:3. When the height of the initial contact layers is within the foregoing range, the initial contact layer has a relatively small resistance, and at the same time the difficulty of subsequently patterning the initial contact layer can be further reduced.

The invention claimed is:

1. A method for manufacturing a semiconductor structure, comprising:
   providing a base, a plurality of bit lines extending in a first direction and a groove located between two adjacent ones of the bit lines being provided on the base;
   forming an initial contact layer and an initial protection layer filling the groove, the initial contact layer being in contact with the base, the initial protection layer being located on the initial contact layer;
   performing a patterning treatment to the initial contact layer and the initial protection layer, so as to form a plurality of contact layers that are discrete from each other and a plurality of protection layers that are discrete from each other;

forming a dielectric layer between two adjacent ones of the contact layers, the dielectric layer being further located between two adjacent ones of the protection layers, a material of the dielectric layer being different from a material of the protection layers; and after forming the dielectric layer, removing the protection layers.

2. The method for manufacturing a semiconductor structure according to claim 1, wherein forming the initial contact layer and the initial protection layer comprises:

forming an initial contact material layer filling up the groove;

etching back the initial contact material layer to make a top surface of the remaining initial contact material layer lower than a top surface of the bit lines, the remaining initial contact material layer serving as the initial contact layer; and forming the initial protection layer on the initial contact layer, a top surface of the initial protection layer being not lower than a top surface of the bit lines.

3. The method for manufacturing a semiconductor structure according to claim 2, wherein the initial contact material layer is formed by using a low-pressure chemical vapor deposition method, and process parameters of the low-pressure chemical vapor deposition method comprise a temperature of 380° C. to 500° C. and a gas pressure of 1 Torr to 3 Torr.

4. The method for manufacturing a semiconductor structure according to claim 2, wherein a process for forming the initial protection layer comprises a spin coating process.

5. The method for manufacturing a semiconductor structure according to claim 1, wherein a ratio of a height of the initial contact layer to a height of the bit lines is 1:3 to 2:3.

6. The method for manufacturing a semiconductor structure according to claim 1, wherein the patterning treatment is performed by using a dry etching process, and process parameters of the dry etching process comprise: a temperature of 20° C. to 80° C., a pressure of 5 mTorr to 50 mTorr and a radio frequency power of 400 W to 1500 W.

7. The method for manufacturing a semiconductor structure according to claim 1, wherein the patterning treatment is performed by using a dry etching process, and an etching gas used in the dry etching process comprises: one or more of $C_4F_6$, $C_4F_8$, $Cl_2$, HBr, Ar, He, CO, $O_2$ and $N_2$.

8. The method for manufacturing a semiconductor structure according to claim 1, wherein in an etching process of removing the protection layers, an etching selection ratio of the material of the protection layers to the material of the dielectric layer is 10:1 to 100:1.

9. The method for manufacturing a semiconductor structure according to claim 8, wherein the material of the protection layers comprises silicon oxide; and the material of the dielectric layers comprises silicon nitride.

10. The method for manufacturing a semiconductor structure according to claim 1, further comprising: after removing the protection layers, forming a plurality of connection layers on the plurality of the contact layers, the dielectric layer being further located between two adjacent ones of the connection layers.

11. The method for manufacturing a semiconductor structure according to claim 1, wherein the patterning treatment is performed by using a dry etching process, and an etching gas used in the dry etching process comprises: one or more of $C_4F_6$, $C_4F_8$, $Cl_2$, HBr, Ar, He, CO, $O_2$ and $N_2$.

12. A semiconductor structure, comprising:

a base, a plurality of bit lines extending in a first direction being provided on the base, each of the bit lines comprising a conductive layer and an insulating cap layer that are stacked;

a plurality of contact layers, each located between two adjacent ones of the bit lines and being discrete from each other, the contact layers being in contact with the base, top surfaces of the contact layers being lower than top surfaces of the bit lines, the top surfaces of the contact layers being flush with a top surface of the conductive layer; and a dielectric layer located between two adjacent ones of the contact layers, the dielectric layer being in contact with the base.

13. The semiconductor structure according to claim 12, wherein the dielectric layer is further located in the insulating cap layers, and the insulating cap layers expose a top surface of the dielectric layer; and the dielectric layer extends in a second direction, and the second direction is different from the first direction.

14. The semiconductor structure according to claim 12, further comprising: a plurality of connection layers located on the contact layers, the dielectric layer being further located between two adjacent ones of the connection layers.

15. A method for manufacturing a semiconductor structure, comprising:

providing a base, a plurality of bit lines extending in a first direction and a groove located between two adjacent ones of the bit lines being provided on the base, each of the bit lines comprises a conductive layer and an insulating cap layer that are stacked;

forming an initial contact layer and an initial protection layer filling the groove, the initial contact layer being in contact with the base, the initial protection layer being located on the initial contact layer;

performing a patterning treatment to the initial contact layer and the initial protection layer, so as to form a plurality of contact layers that are discrete from each other and a plurality of protection layers that are discrete from each other, wherein the patterning treatment comprises:

etching the initial contact layer, the initial protection layer and a part of the insulating cap layer to form an isolation groove spanning the initial protection layer and the insulating cap layer, the isolation groove further penetrating the initial contact layer, a bottom of the isolation groove located in the remaining insulating cap layer being higher than a top of the conductive layer;

the remaining initial contact layer serves as the plurality of contact layers, and the remaining initial protection layer serves as the plurality of the protection layers;

the isolation groove extends in a second direction, and the second direction is different from the first direction;

after the patterning treatment, forming a dielectric layer between two adjacent ones of the contact layers, the dielectric layer being further to fill the isolation groove and located between two adjacent ones of the protection layers, a material of the dielectric layer being different from a material of the protection layers.

16. The method for manufacturing a semiconductor structure according to claim 15, wherein an etching selection ratio of the initial contact layer to the insulating cap layer in the patterning treatment is 3:1 to 50:1.

17. The method for manufacturing a semiconductor structure according to claim 16, wherein a material of the initial contact layer comprises polycrystalline silicon, and a material of the insulating cap layer comprises silicon nitride.

18. The method for manufacturing a semiconductor structure according to claim 15, wherein the patterning treatment is performed by using a dry etching process, and process parameters of the dry etching process comprise: a temperature of 20° C. to 80° C., a pressure of 5 mTorr to 50 mTorr and a radio frequency power of 400 W to 1500 W.

\* \* \* \* \*